(12) United States Patent
Ukawa et al.

(10) Patent No.: US 11,189,764 B2
(45) Date of Patent: Nov. 30, 2021

(54) LIGHT-EMITTING DEVICE AND MANUFACTURING METHOD THEREOF

(71) Applicant: NICHIA CORPORATION, Anan (JP)

(72) Inventors: Hiroaki Ukawa, Itano-gun (JP); Ryuichi Nakagami, Anan (JP); Ryuji Muranaka, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/687,853

(22) Filed: Nov. 19, 2019

(65) Prior Publication Data

US 2020/0168776 A1 May 28, 2020

(30) Foreign Application Priority Data

Nov. 22, 2018 (JP) .............................. JP2018-219726
Sep. 6, 2019 (JP) .............................. JP2019-162884

(51) Int. Cl.
| | |
|---|---|
| *H01L 33/60* | (2010.01) |
| *H01L 33/56* | (2010.01) |
| *H01L 33/10* | (2010.01) |
| *H01L 33/46* | (2010.01) |
| *H01L 33/54* | (2010.01) |
| *H01L 33/58* | (2010.01) |

(52) U.S. Cl.
CPC .............. *H01L 33/60* (2013.01); *H01L 33/10* (2013.01); *H01L 33/46* (2013.01); *H01L 33/54* (2013.01); *H01L 33/56* (2013.01); *H01L 33/58* (2013.01)

(58) Field of Classification Search
CPC ......... H01L 33/56; H01L 33/60; H01L 33/46; H01L 33/54; H01L 33/58
See application file for complete search history.

(56) References Cited

U.S. PATENT DOCUMENTS

| | | | | |
|---|---|---|---|---|
| 2004/0012958 A1* | 1/2004 | Hashimoto | ............. | H01L 33/60 362/241 |
| 2009/0230413 A1* | 9/2009 | Kobayakawa | ........ | H01L 33/483 257/91 |
| 2012/0193665 A1* | 8/2012 | Yamada | .................. | H01L 24/17 257/98 |
| 2014/0071689 A1* | 3/2014 | Yoon | ...................... | F21V 13/04 362/296.01 |

(Continued)

FOREIGN PATENT DOCUMENTS

| | | |
|---|---|---|
| JP | 2014-036167 A | 2/2014 |
| JP | 2016-066742 A | 4/2016 |

(Continued)

*Primary Examiner* — Feifei Yeung Lopez
(74) *Attorney, Agent, or Firm* — Foley & Lardner LLP

(57) ABSTRACT

A light-emitting device includes: a base body comprising a resin member, a first lead, and a second lead, wherein the first lead and the second lead are supported by the resin member; a light-emitting element mounted on an upper surface of the base body; a resin frame located on the upper surface of the base body, surrounding the light-emitting element; and a first resin located inside the resin frame to cover a part of side surfaces of the light-emitting element, a part of an inner side surface of the resin frame, and the upper surface of the base body, wherein the first resin includes: a reflection material layer that contains a reflection material, and a resin layer that is located on an upper surface of the reflective material layer and does not contain the reflective material.

23 Claims, 8 Drawing Sheets

(56) References Cited

U.S. PATENT DOCUMENTS

| | | | | |
|---|---|---|---|---|
| 2014/0103370 A1* | 4/2014 | Toyama | ............... | H01L 33/60 |
| | | | | 257/88 |
| 2015/0016107 A1* | 1/2015 | Wimmer | ............ | H01L 25/0753 |
| | | | | 362/235 |
| 2016/0093779 A1 | 3/2016 | Maeno et al. | | |
| 2016/0133610 A1* | 5/2016 | Reiherzer | ............... | H01L 33/54 |
| | | | | 257/98 |

FOREIGN PATENT DOCUMENTS

| | | |
|---|---|---|
| JP | 2016-072412 A | 5/2016 |
| JP | 2017-168559 A | 9/2017 |
| JP | 2018-026596 A | 2/2018 |

* cited by examiner

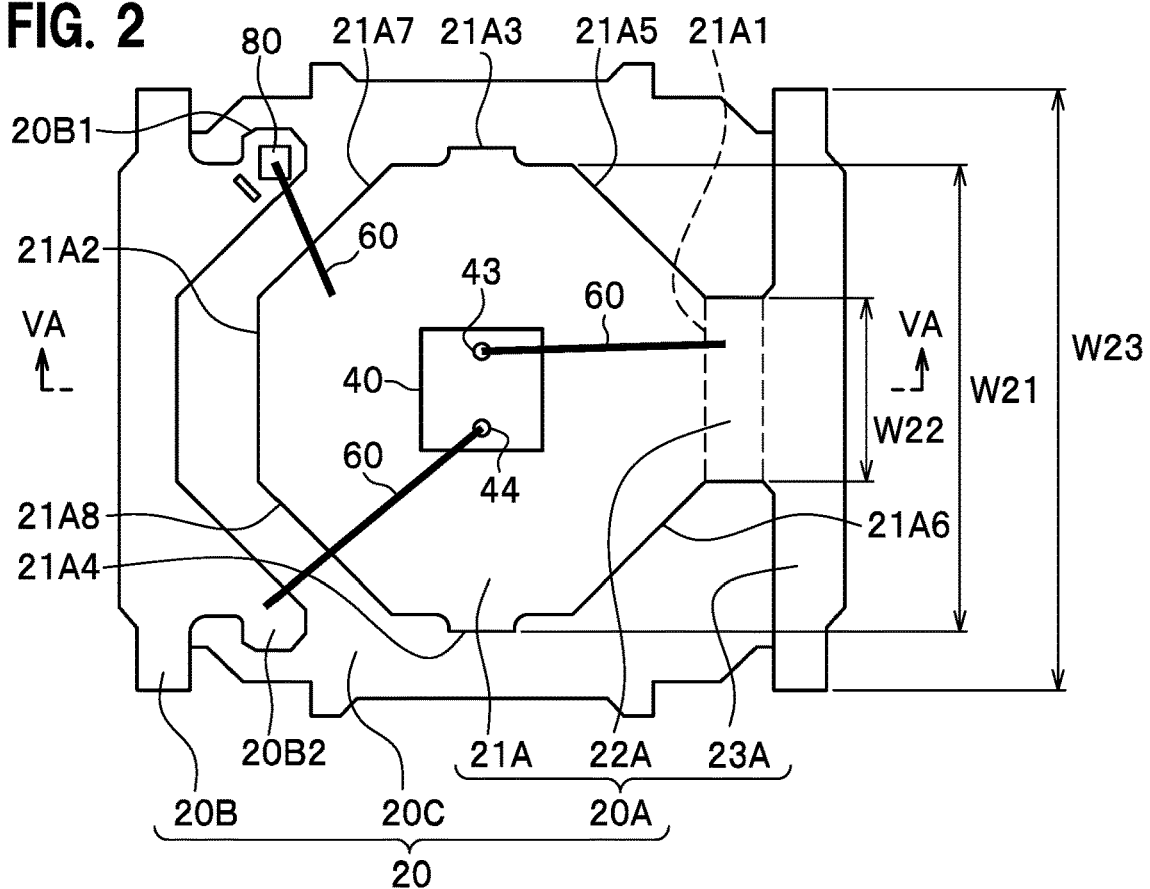
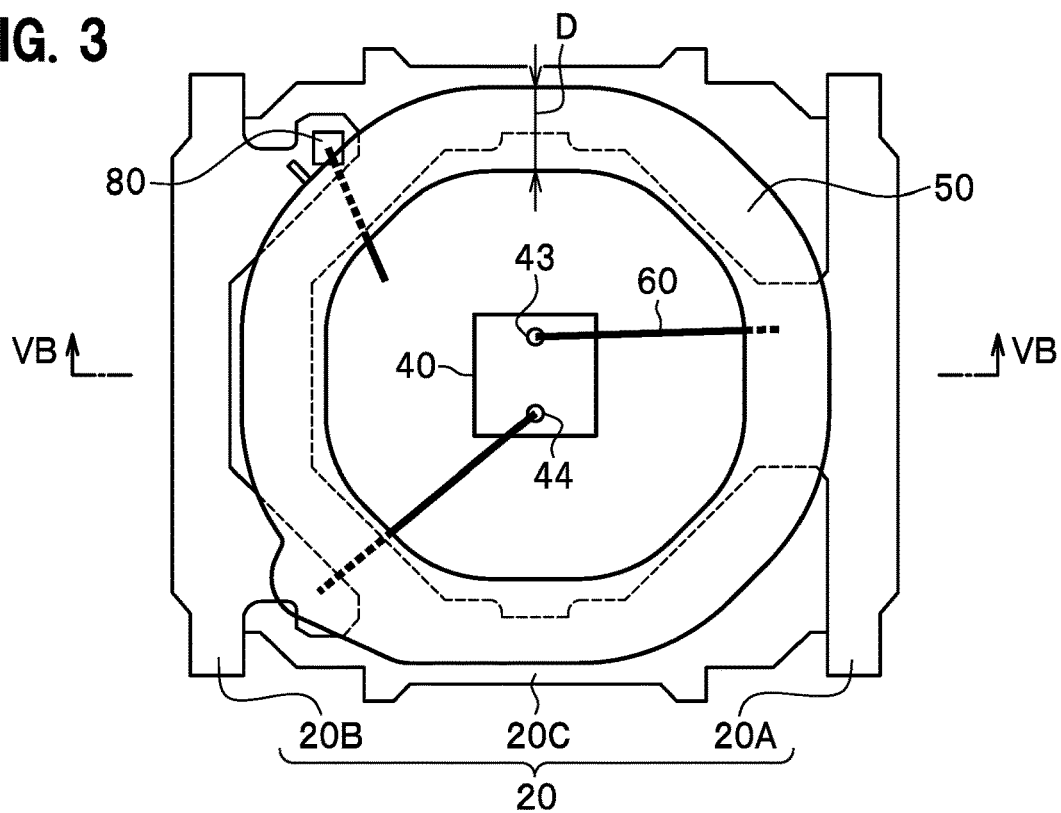

LIGHT-EMITTING DEVICE AND MANUFACTURING METHOD THEREOF

CROSS-REFERENCE TO RELATED APPLICATIONS

This application is based upon and claims priority to Japanese Patent Application No. 2018-219726, filed on Nov. 22, 2018, and Japanese Patent Application No. 2019-162884, filed on Sep. 6, 2019, the entire contents of which are incorporated herein by reference.

BACKGROUND

The present disclosure relates to a light-emitting device and a method of manufacturing the same.

A light-emitting device employing a light-emitting element, such as a light-emitting diode or a laser diode, is used in various fields including general lighting such as interior lighting, on-board light sources for vehicles, backlights of liquid crystal displays, and the like. The performance required for these light-emitting devices is increasing every day, and a further increase in reliability is desired.

A known light-emitting device includes a light-emitting element mounted on upper surface of a lead, a frame body surrounding the light-emitting element and arranged on the upper surface of the lead, and a reflection member covering the side surfaces of the frame and of the light-emitting element (for example, refer to Japanese Patent Publication No. 2016-072412A).

SUMMARY

However, for a light-emitting device, as the application fields are getting wider, better light extraction and better adhesion of the reflection members to the frame body and the lead have been desired.

Therefore, an object of certain embodiments of the present disclosure is to provide a light-emitting device having better light extraction and better adhesion, and to provide a method of manufacturing the same.

According to one embodiment, a light-emitting device includes: a base body comprising a resin member, a first lead, and a second lead, wherein the first lead and the second lead are supported by the resin member; a light-emitting element mounted on an upper surface of the base body; a resin frame located on the upper surface of the base body, surrounding the light-emitting element; and a first resin located inside the resin frame to cover a part of side surfaces of the light-emitting element, a part of an inner side surface of the resin frame, and the upper surface of the base body, wherein the first resin comprises: a reflection material layer that contains a reflection material, and a resin layer that is located on an upper surface of the reflective material layer and does not contain the reflective material; wherein the reflective material is located in the reflection material layer to cover the upper surface of the base body; and wherein the upper surface of the resin layer comprises a flat region and a sloped region, wherein a height of the upper surface of the resin layer, measured from the upper surface of the base body, gradually increases as the upper surface of the resin layer approaches the inner side surface of the resin frame.

According to another embodiment, a light-emitting device includes: a base member; a base body formed on an upper surface of the base member, the base body comprising a wiring layer; a light-emitting element mounted on an upper surface of the base body; a resin frame located on the upper surface of the base body; and a first resin located inside the resin frame to cover a part of side surfaces of the light-emitting element, a part of inner side surface of the resin frame, and the upper surface of the base body, the first resin comprising: a reflective material layer that contains a reflective material, and a resin layer that is located on an upper surface of the reflective material layer and does not contain the reflective material; wherein the reflective material is located in the reflective material layer to cover the upper surface of the base body; and wherein the upper surface of the resin layer comprises a flat region and a sloped region, wherein a height of the upper surface of the resin layer, measured from the upper surface of the base body, gradually increases as the upper surface of the resin layer approaches the inner side surface of the resin frame.

According to another embodiment, a method of manufacturing a light-emitting device includes: mounting a light-emitting element on an upper surface of a base body; forming a resin frame on the upper surface of the base body to surround the light-emitting element; injecting a first resin containing a reflective material inside the resin frame so that the first resin covers a part of side surfaces of the light-emitting element, a part of an inner side surface of the resin frame, and the upper surface of the base body; and separating the first resin into a reflective material layer containing the reflective material and a resin layer not containing the reflective material, by use of revolution of the base body to apply a centrifugal force to the base body.

According to certain embodiments of the light-emitting device and the method of manufacturing described in the present disclosure, a light-emitting device that has better light extraction and better adhesion of respective parts of the light-emitting device can be obtained.

BRIEF DESCRIPTION OF THE DRAWINGS

FIG. 2 shows a plan view of a light-emitting device according to the first embodiment, in which the resin frame and the first resin are omitted.

FIG. 3 shows a plan view of a light-emitting device according to the first embodiment, in which the first resin is omitted.

DETAILED DESCRIPTION

Embodiments of the invention will be explained below with reference to the figures. However, the embodiments described below are merely examples of light-emitting devices for realizing the technical concepts of the present disclosure. The present invention is not limited to the described embodiments. Further, the dimensions, materials, and their relative placements, etc., that are described in the embodiments are not intended to limit the scope of the present invention, and are merely explanatory examples. It should be noted that the size and the positional relationships of the members shown in respective figures can be exaggerated. Further, in the following explanations, the same names and reference signs show identical members or members with identical functions, and thus a repeated detailed explanation may be omitted.

First Embodiment

<Light-Emitting Device>

First, an explanation of a light-emitting device according to a first embodiment will be provided.

Figure 1A:
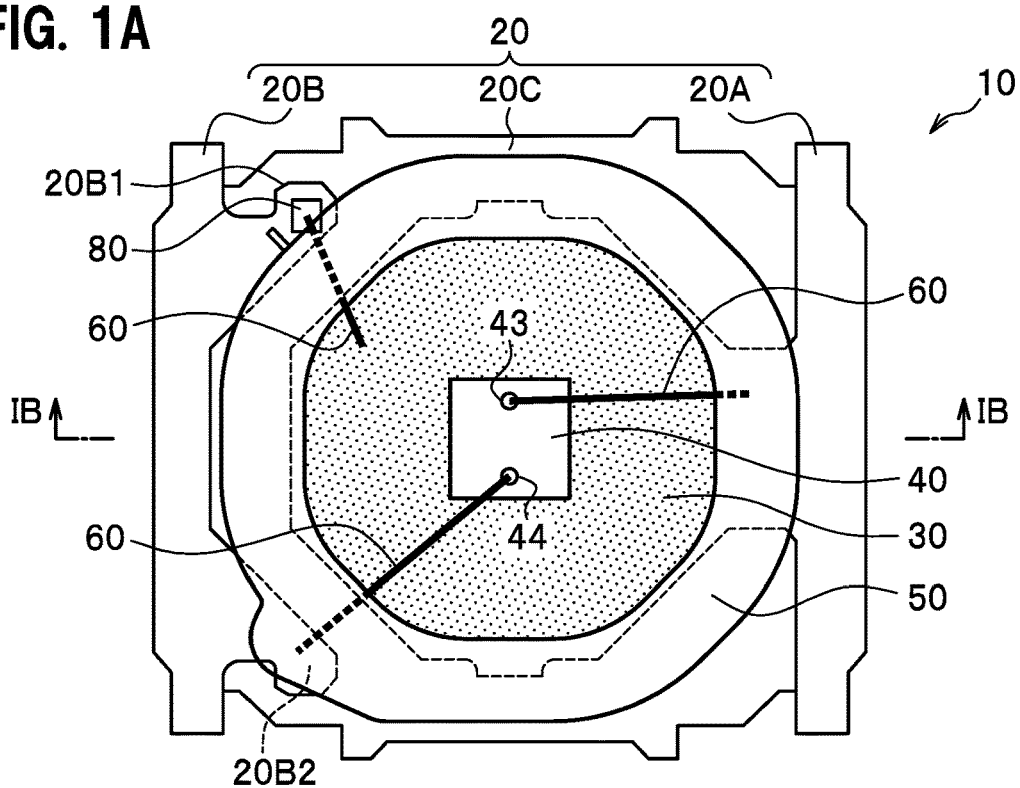
FIG. 1A schematically shows a plan view of a construction of a light-emitting device according to a first embodiment.
Figure 1B:
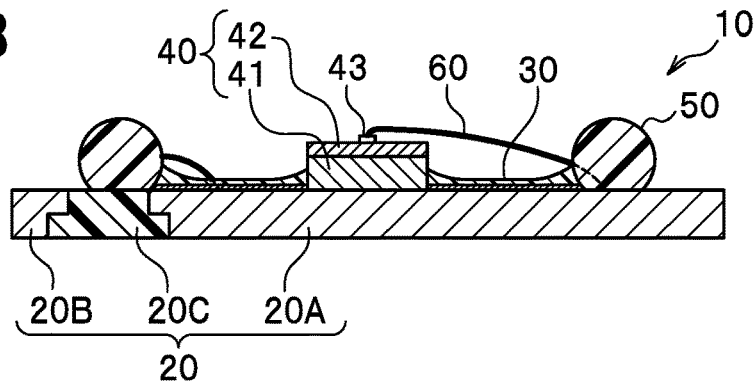
FIG. 1B shows a cross-sectional view along the IB-IB line of FIG. 1A.
Figure 1C:
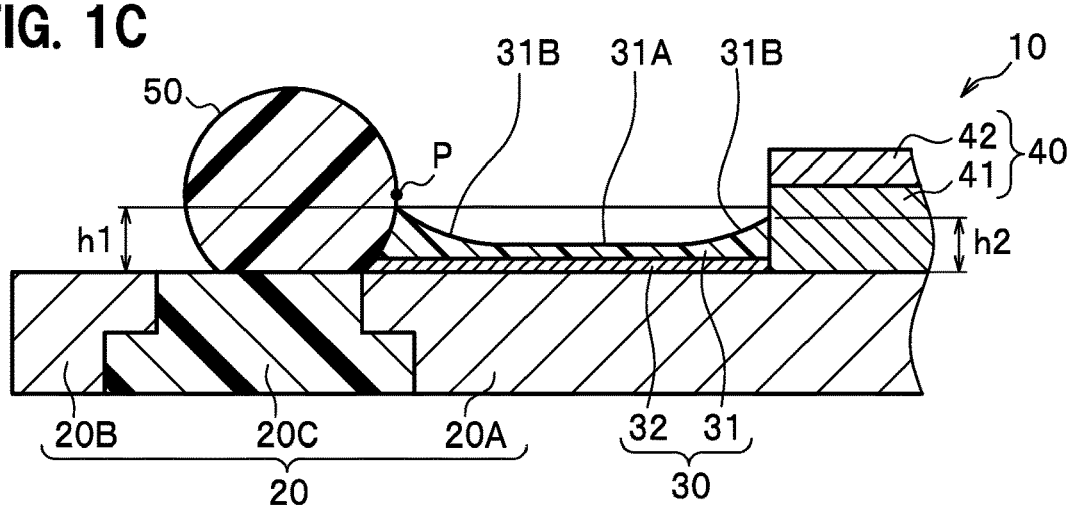
FIG. 1C shows an enlarged cross-sectional view of a portion of FIG. 1B.

FIG. 1A schematically shows a plan view of a construction of a light-emitting device according to the first embodiment. FIG. 1B shows a cross-sectional view along the IB-IB line of FIG. 1A. FIG. 1C shows an enlarged cross-sectional view of a portion of FIG. 1B. FIG. 2 shows a plan view of a light-emitting device according to the first embodiment, in which the resin frame and the first resin are omitted. FIG. 3 shows a plan view of a light-emitting device according to the first embodiment, in which the first resin is omitted.

As shown in FIGS. 1A-1C, the light-emitting device 10 includes: a base body 20 having a first lead 20A and a second lead 20B that are supported by a resin member 20C; a light-emitting element 40 mounted on an upper surface of the base body 20; a resin frame 50 arranged on the upper surface of the base body 20; and a first resin 30 that contains a reflective material and is arranged inside the resin frame 50 to cover a part of side surfaces of the light-emitting element 40, a part of inner side surface of the resin frame 50, and the upper surface of the base body 20; wherein the first resin 30 includes a reflective material layer 32 that contains the reflective material and a resin layer 31 that is arranged on the upper surface of the reflective material layer 32 and does not contain the reflective material; wherein, in the reflective material layer 32, the reflective material is arranged to cover the upper surface of the base body 20; and wherein the upper surface of the resin layer 31, seen in cross section, includes a flat region 31A and a sloped region 31B having a height h1, measured from the upper surface of the base body, being gradually elevated as the upper surface of the resin layer 31 approaches the inner side surface of the resin frame 50. In the following, respective configurations are explained.

(Base Body)

As shown in FIG. 2, the base body 20 includes the first lead 20A, the second lead 20B, and the resin member 20C supporting the first lead 20A and the second lead 20B in a state being separated from each other.

The first lead 20A includes, for example, a mounting portion 21A formed substantially as a polygonal shape in the center of the base body 20, in which the light-emitting element 40 is mounted, a terminal portion 23A arranged on one end of the base body 20, and a connection portion 22A connecting the mounting portion 21A and the terminal portion 23A. A width W22 of the connection portion 22A is smaller than a width W21 of the mounting portion 21A and a width W23A of the terminal portion 23A. The width W23 of the terminal portion 23A is wider than the width W21 of the mounting portion 21A and is comparable to the base body 20. It should be noted that the connection portion 22A includes a region being connected with a wire 60 from the light-emitting element 40. Here, in the first lead 20A and in the second lead 20B, the widths represent a maximum length in a direction perpendicular to a line connecting the center of the mounting portion 21A and the center of the connecting portion 22A.

Further, the mounting portion 21A is formed substantially as an octagon. Thus, the mounting portion 21A includes a first side 21A1 having a same length as the width W22 of the connecting portion 22A, a second side 21A2 being parallel and being opposed to the first side 21A1, a third side 21A3 being perpendicular to the first side 21A1 and to the second side 21A2, a fourth side 21A4 being perpendicular to the first side 21A1 and to the second side 21A2 and being opposed to the third side 21A3, a fifth side 21A5 being slanted and connecting the first side 21A1 and the third side 21A3, a sixth side 21A6 being slanted and connecting the first side 21A1 and the fourth side 21A4, a seventh side 21A7 being slanted and connecting the second side 21A2 and the third side 21A3, and an eighth side 21A8 being slanted and connecting the second side 21A2 and the fourth side 21A4. Further, the mounting portion 21A includes protruding portions that are formed to protrude respectively from the third side 21A3 and from the fourth side 21A4.

The second lead 20B is arranged to have a form that makes the distances to the second side 21A2, to the sixth side 21A6, and to the seventh side 21A7 to be approximately constant. Further, the second lead 20B has a width approximately equal to the width W23 of the terminal portion 23A, and, in a longitudinal direction, the second lead 20B has one end portion and the other end portion that are bent to the side of the mounting portion 21A to be wider in area, thus forming connecting end portions 20B1, 20B2, etc. One connecting end portion 20B1 includes an area for mounting a protection element 80, and the other connecting end portion 20B2 includes an area for connecting a wire 60 of the light-emitting element 40.

Seen in a plan view, the area of the first lead 20A may be larger than the area of the second lead 20B. Because a light-emitting element 40 is mounted on upper surface of the mounting portion 21A of the first lead 20A, due to the larger area of the mounting portion 21A of the first lead 20A, the conductivity for the heat produced in the light-emitting element 40 to the first lead 20A can be more enhanced. Due to this, the temperature increase of the light-emitting element 40 can be suppressed, and the reliability of the light-emitting device 10 can be improved.

The end portions of the first lead 20A and/or the second lead 20B may include a recessed portion or a protruding portion. By providing a recessed portion or a protruding portion in a place where the first lead 20A and/or second lead 20B contact with the resin member 20C, it becomes possible to increase the contact area between the first lead 20A and/or second lead 20B and the resin member 20C. Due to this, the adhesion between the first lead 20A and/or second lead 20B and the resin member 20C can be improved.

The first lead 20A and the second lead 20B are used to apply a voltage from an external power supply to an electronic component such as the light-emitting element 40. The first lead 20A and the second lead 20B may be formed from a material that has a relatively large thermal conductivity. For example, by using a material having a thermal conductivity larger than around 200 W/(m·K), the conductivity for the heat produced in the light-emitting element 40 to the first lead 20A can be more enhanced.

The first lead 20A and the second lead 20B may be formed from a material that can be easily worked by punching or cutting and has a high strength. For example, a single layer or a laminated body of a metal such as copper, aluminum, gold, silver, tungsten, iron, nickel or an alloy of these metals, phosphor bronze, copper containing iron, and so on, can be used as a base material. It should be noted that the metal layer of the laminated body can be provided to the entire surface of the first lead 20A and the second lead 20B, or it can be provided partially. In addition, the metal layer of the laminated body can be provided to only one lead.

The first lead 20A and the second lead 20B can also include a reflective film on their surfaces. For the reflective film, one or more metals of aluminum, copper, gold, etc., can be used. In particular, silver may be used for the reflective film. By such an arrangement, it is possible to improve the light extraction efficiency of the light-emitting device 10.

As a method of forming the reflective film on the first lead 20A and on the second lead 20B, various methods such as plating, evaporation, sputtering, ion-beam assisted evaporation, etc., can be considered. The film thickness can be a film thickness by which the light from the light-emitting element 40 can be effectively reflected, for example around 20 nm-10 μm, maybe around 50 nm-5 μm, or around 100 nm-3 μm. It should be noted that the thickness and the shape of the first lead 20A and the second lead 20B can be appropriately arranged as known in the art.

The resin member 20C is arranged around the first lead 20A, between the second lead 20B and the first lead 20A, and around an end portion and the other end portion of the second lead 20B, supporting the first lead 20A and the second lead 20B. This resin member 20C is, for example, is formed by injecting a molding resin from a region (resin injecting portion) that is widened as it becomes more distant from a connection portion 22A between the terminal portion 23A and the two slanted sides, the fifth side 21A5 and the sixth side 21A6, of the mounting portion 21A, and by filling the molding resin into around the first lead 20A, into between the second lead 20B and the first lead 20A, and into around a one end portion and the other end portion of the second lead 20B. By injecting the molding resin from the resin injecting portion in this way, it is possible to easily fill the molding resin also into the region far from the resin injecting portion, for example into between the second lead 20B and the first lead 20A. Further, because the shape of the mounting region 21A of the first lead 20A is arranged to be approximately a polygon, and because, in its corner portions, the fifth side 21A5, the sixth side 21A6, the seventh side 21A7, and the eighth side 21A8 are provided, it becomes easier to conduct the molding resin into around the first lead 20A, into between the second lead 20B and the first lead 20A, and into around one end portion and the other end portion of the second lead 20B.

As a material for the resin member 20C, epoxy resin, silicone resin, BT resin, polyamide resin, polyimide resin, nylon resin, non-saturated polyester, etc. can be considered. These resin materials can be arranged to contain a coloring agent, a filling material, a reinforcing fiber, etc. that are known in the art. When, as a coloring agent, a white filler such as titanium oxide, zinc oxide for a coloring material is used, it is possible to improve the light extraction efficiency of the light-emitting device. Further, when these resins are arranged to contain a black filler having a large thermal radiation coefficient such as carbon black, the heat can efficiently escape from the light-emitting device 40. As a filler, silicon oxide, aluminum oxide, etc. can be considered. As a reinforcing fiber, silicon oxide, potassium titanate, etc. can be considered.

(Light-Emitting Element 40)

The light-emitting element 40 is mounted on upper surface of the mounting portion 21A of the first lead 20A. The light-emitting element 40 is a semiconductor element that emits light by applying a voltage and has a light-emitting surface on its upper surface. The light-emitting element 40 may include an element-substrate 41 that consists of sapphire and the like, being arranged on a side to the base body 20, and a semiconductor layer 42 constituted of a nitride semiconductor, etc., being arranged on the element-substrate 41. The wavelength of the light emitted from the light-emitting element 40 can be selected from ultraviolet region to infrared region including the visible region (380-780 nm), according to composition of the nitride semiconductor. For example, for a light-emitting element 40 having a peak wavelength of 430-490 nm, $In_XAl_YGa_{1-X-Y}N$ ($0 \leq X$, $0 \leq Y$, $X+Y \leq 1$) and the like can be used as a nitride semiconductor. Further, the light-emitting element 40 can be arranged on upper surface of the first lead 20A via a submount.

The shape of the light-emitting element 40 can be, seen in a top view, a triangle, a tetragon, a hexagon, or a shape similar to these, or any shape. Further, the light-emitting element 40 can have a configuration of electrodes on one side, in which a n-electrode 43 and a p-electrode 44 are formed on one same side, or can have a configuration of electrodes on both sides, in which the n-electrode 43 and the p-electrode 44 are formed on two different sides. The n-electrode 43 and the p-electrode 44 of the light-emitting element 40 can also be so configured that they are connected to the first lead 20A and to the second lead 20B respectively via a wire 60. It should be noted that the n-electrode 43 and the p-electrode 44 of the light-emitting element 40 can also have a configuration that they are connected respectively to the second lead 20B and to the first lead 20A directly. For the wire 60, a metallic material having a good conductivity such as gold, aluminum, copper, silver, etc. can be used.

In case when the light-emitting element 40 has a configuration of electrodes on one side, the light-emitting element 40 is mounted face-up on the first lead 20A. The face-up mounting is a construction that the light-emitting element 40 is mounted with the side opposing to the side of where the electrodes are formed down to the base body 20. The joining material for the light-emitting element 40 and the first lead 20A can be an insulating joining material or a conductive joining material, and any known joining material can be used. For example, as an insulating joining material, an epoxy resin, a silicone resin, or a modified resin thereof can be considered, and as a conductive joining material, a conductive paste of silver, gold, palladium, etc., a solder of such as Au—Sn eutectic crystal, and a brazing material of such as low melting point, can be considered.

In case when the light-emitting element 40 has a configuration of electrodes on both sides, as a joining material for the light-emitting element 40 and the first lead 20A, any conductive joining material can be used, and a known joining material can be used. For example, as a conductive joining material, a conductive paste of silver, gold, palladium, etc., a solder of such as Au—Sn eutectic crystal, and a brazing material of such as low melting point, can be considered.

(Resin Frame)

As shown in FIG. 3, the resin frame 50 is a frame body that is an annular frame body arranged on upper surface of the base body 20 to enclose the light-emitting element 40. The shapes of inner rim and outer rim of the resin frame 50 can be, seen in a top view, a polygon such as a circle, an oval, a square, a hexagon, an octagon, a shape having corners of a polygon chamfered, or any various shape. Because the resin frame 50 is arranged to surround the light-emitting element 40, an uncured raw material, which turns to be the first resin 30 arranged inside the resin frame 50, can be kept inside the resin frame 50. The resin frame 50 is formed by curing the arranged uncured raw material, which turns into the resin frame 50, in a desired region for the resin frame 50.

The resin frame 50 may be arranged to cover a connection portion of the first lead 20A and the resin member 20C, namely it is so arranged that only the mounting portion 21A of the first lead 20A is exposed inside the resin frame 50 and the resin member 20C is not exposed. Because the resin member 20C is not exposed inside the resin frame 50, a light penetrated the first resin 30 cannot be absorbed by the black filler etc. as contained in the resin member 20C. As a result, the light penetrated the first resin 30 is reflected by the upper surface of the mounting portion 21A, and thus the light extraction from the light-emitting device 10 is improved.

Further, the dimension of the cross-sectional diameter D of the resin frame 50 (refer to FIG. 3) is appropriately selected so that the mounting portion 21A of the first lead 20A is exposed inside the resin frame 50, and so that a portion of the first lead 20A as well as a portion of the second lead 20B and a portion of the resin member 20C are exposed outside the resin frame 50.

The cross-sectional shape of the resin frame 50 (refer to FIG. 1C) can have one of various shapes, such as a circular shape including a partial circle, an oval including a partial oval, a rectangular shape, as far as it is possible to keep the uncured first resin 30 inside the resin frame 50. The cross-sectional shape of the resin frame 50 may have a circular shape including a partial circle so that the inner side surface of the resin frame 50 facing toward the light-emitting element 40 has a convex shape, and thus the cross-sectional shape has a curved shape with a top of the convex shape, namely with the inner-most point P of the resin frame 50. By arranging the cross-sectional shape of the resin frame 50 to have a circular shape including the inner-most point P of a partial circle, the reflective material layer 32 of the first resin 30 is formed beneath the resin frame 50. Then, the reflective material layer 32 is formed to enter beneath the inner-most point P of the resin frame 50. As a result, the light extraction from the light-emitting device 10 is improved, because a light from the light-emitting element 40 entering beneath the resin frame 50 is reflected upwards, to the direction of light extraction, by the reflective material layer 32.

As a material for the resin frame 50, phenol resin, epoxy resin, BT resin, PPA, and silicone resin can be considered. In particular, as a material for the resin frame 50, a silicone resin having a better light resistance is preferred. For the resin frame 50, it is preferred that the base material for the base of the resin frame 50 is a material identical to the base resin of the first resin 30. Due to this, the adhesion between the resin frame 50 and the first resin 30 is improved.

The resin frame 50 can efficiently reflect the light from the light-emitting element 40, when a powder of a reflective material, which is hard to absorb the light from the light-emitting element 40 and has a larger refractive index than the base resin, is dispersed in the base resin. As a reflective material, for example, titanium oxide, aluminum oxide, zirconium oxide, magnesium oxide can be used. In particular, titanium oxide is preferred, because it is relatively stable against water and has a large refractive index compared to water and the like. The resin frame 50 is a member that may have a reflectivity larger than 60% against the light from the light-emitting element 40, or larger than or equal to 70%. In this manner, the light arrived at the resin frame 50 is hard to be absorbed by the resin frame 50, through which the light extraction from the light-emitting device 10 is improved.

(First Resin)

The first resin 30 is arranged inside the resin frame 50, namely in the region surrounded by the resin frame 50, and is a resin layer containing a reflective material, which covers a part of the side surface of the light-emitting element 40, a part of the inner side surface of the resin frame 50, and the upper surface of the base body 20. Because the first resin 30 covers a part of the side surface of the light-emitting element 40 and does not cover the entire side surface, the light emitted to side direction from the light-emitting element 40 is not blocked, and therefore the light extraction from the light-emitting device 10 is improved. Because the first resin 30 covers a part of the side surface of the resin frame 50, the adhesion between the first resin 30 and the resin frame 50 is improved.

The first resin 30 includes the reflective material layer 32 and a resin layer 31 that is arranged on upper surface of the reflective material layer 32 and does not contain the reflective material, namely the resin layer 31 being configured by a base resin that turns into a base of the first resin 30. It should be noted that the reflective material layer 32 is formed by sedimentation of the reflective material within the resin layer 31, and therefore there is no interface between the reflective layer 32 and the resin layer 31. Thus, the first resin 30 is not such as composed of two members, the resin layer 31 and the reflective material layer 32. Further, for the purpose of convenience, a portion that separates the reflective layer 32 and the resin layer 31 may be occasionally described as "upper surface of reflective layer 32".

The reflective material layer 32 is arranged so that the reflective material is arranged to cover the upper surface of the base body 20 between the resin frame 50 and the light-emitting element 40. Due to this, because the joining between the first resin 30 and the base body 20 becomes a joining between the reflective material including metal particles and the first lead 20A of the base body 20 including a metal material, the adhesion between the first resin 30 and the base body 20 is improved. Further, when the surfaces of the first lead 20A constituting the base body 20 is plated with Ag, sulfuration of Ag is suppressed, because the Ag plating layer is covered by the reflective layer 32.

The resin layer 31, seen in a cross-sectional view, has a flat region 31A and a sloped region 31B of which height h1 on the side to the resin frame 50 measured from the upper surface of the base body 20 becomes larger as it approaches to the inner side surface of the resin frame 50. The entire side surface of the resin layer 31 facing toward the resin frame 50 and the inner side surface of the resin frame 50 may be contacted. Further, for the resin layer 31, the upper surface, seen in cross-sectional view, may have also a sloped region 31B of which height h2 on the side to the light-emitting element 40 measured from the upper surface of the base body 20 becomes larger as it approaches to the inner side surface of the light-emitting element 40.

For the first resin 30, because the upper surface of the resin layer 31 has the sloped region 31B on the side to the resin frame 50 and the entire side surface of the resin layer 31 on the side to the resin frame 50 contacts with the inner side surface of the resin frame 50, the contact surface area between the resin frame 50 and the resin layer 31 increases, improving adhesion between the resin frame 50 and the first resin 30. Further, for the first resin 30, because the upper surface of the resin layer 31 has a sloped layer 31B on the side to the light-emitting element 40, the contact surface area between the light-emitting element 40 and the resin layer 31 is increased, improving the adhesion between the light-emitting element 40 and the first resin 30. Further, the sloped regions 31B on the side to the resin frame 50 and on the side to the light-emitting element 40 may have a curved shape. When the sloped regions 31 B have a curved shape, then there exists no stress concentrating portions and therefore the adhesion is improved.

The height h1 of the resin layer 31 measured from the base body 20 is larger than the height h2 of the resin layer 31 measured from the base body 20. Due to this, because the contact area between the resin frame 50 and the resin layer 31 is more increased, the adhesion between the resin frame 50 and the first resin 30 is further improved.

The sloping degree of the sloped region 31B of the resin layer 31 on the side to the resin frame 50 may have a sloping angle between 30° and 60°. A similar sloping degree can be applied also to the sloped region 31B on the side to the light-emitting element 40. When the sloping degree is employed as mentioned, because the contact area between the first resin 30 and the resin frame 50 or the light-emitting element 40 is increased, the adhesion is improved.

For the reflective material layer 32, seen in cross-sectional view, the upper surface may be flat. Namely, the upper surface of the reflective material layer 32 may have a constant thickness along the upper surface of the base body 20. The reflective material layer 32 contains a reflective material that has less adhesion to the resin frame 50. On the other hand, the resin layer 31 has a better adhesion to the resin frame 50, because the base of the resin layer 31 is configured with a resin. Therefore, when the upper surface of the reflective material layer 32 is flat, the reflective material layer 32 comes into such a condition that the reflective material layer 32 is located between the partial circle below the inner-most point P of the resin frame 50 and the upper surface of the base body 20. As a result, the end portion of the reflective material layer 32 enters beneath the lower portion of the resin frame 50, by which the reflective material layer 32 becomes less separable. Further, if the upper surface of the reflective material layer 32 is flat, when seen in cross-sectional view, because the contact area of the reflective material layer 32 against the resin frame 50 can be made less compared with the configuration that the upper surface of the reflective material layer 32 becomes higher as it approaches to the inner side surface of the resin frame 50 similarly to the upper surface of the resin layer 31. Since the contact area of the resin layer 31 against the resin frame 50 can be made larger instead, the adhesion between the first resin 30 and the resin frame 50 is improved.

When the light-emitting element 40 includes the element-substrate 41 arranged on the side to the base body 20 and the semiconductor layer 42 arranged on the element-substrate 41, regarding the upper surface of the first resin 30 covering the side surface of the light-emitting element 40, namely regarding the upper surface of the sloped region 31B on the side to the light-emitting element 40, the height h2 measured from the base body 20 may be lower than the bottom surface of the semiconductor layer 42. Due to this, the light extraction from the light-emitting device 10 is improved, because the light emitted to side direction from the light-emitting element 40 is not blocked.

When inner side surface of the resin frame 50 has a curved shape that bulges to the side facing toward the light-emitting element 40, regarding the upper surface of the sloped region 31B of the first resin 30 covering the inner side surface of the resin frame 50, the height h1 measured from the base body 20 may be lower than the top of the curved shape P. Due to this, because uplifting of the first resin 30 from the base body 20 can be suppressed, the adhesion between the first resin 30 and the base body 20 is further improved.

The first resin 30 is a resin layer including a base resin with a reflective material contained therein. As the base resin, phenol resin, epoxy resin, BT resin, PPA, and silicone resin can be considered. In particular, as a material for the base resin, a silicone resin having a better light resistance is preferred. Regarding the resin frame 50 and the first resin 30, the base resin for the base of the first resin 30 and the base resin of the resin frame 50 may be of same material. Due to this, the adhesion between the resin frame 50 and the first resin 30 is improved.

The first resin 30 can reflect the light from the light-emitting element 40 efficiently by dispersing a powder of reflective material that barely absorbs the light from the light-emitting element 40 and has a larger refractive index than the base resin. As the reflective material, for example, titanium oxide, aluminum oxide, zirconium oxide, magnesium oxide can be used. In particular, titanium oxide is preferred, because it is relatively stable and has a large refractive index against water. The reflective material is a material having a reflectivity that may be larger than 60% against the light from the light-emitting element 40, or larger than or equal to 70%. In this manner, the light arrived at the first resin 30 is hard to be absorbed by the first resin 30, through which the light extraction from the light-emitting device 10 is improved.

The above explanation has been given for the light-emitting device 10 including one light-emitting element 40. However, in an embodiment of the light-emitting device 10, it can be also configured such that a plurality of light-emitting elements 40 are employed and the resin frame 50 is formed to surround the plurality of light-emitting elements 40 collectively. Further, as shown in FIG. 1A, an embodiment of the light-emitting device 10 can also include a protection element 80.

The protection element 80 prevents, for example, a current flow in a reverse direction when a voltage of reverse direction is applied to the light-emitting element 40, or an overcurrent flows through the light-emitting element 40 when a forward voltage higher than the operation voltage of the light-emitting element 40 is applied. As the protection element 80, a protection circuit and an electrostatic protection element are considered, in particular, a Zener diode can be used.

For the light-emitting device 10, the light extraction is improved by including a first resin 30 containing the reflective material, because the light emitted to side direction from the light-emitting element 40 is reflected upwards by the reflective material to the direction of light extraction. In addition, by covering a part of the side surface of the light-emitting element 40 with the first resin 30, the light extraction is further improved, because the light emitted from the light-emitting element 40 is barely blocked. Further, due to the fact that the first resin 30 includes the reflective material layer 32 and the fact that, by this reflective material layer 32, a reflective material is arranged to cover the upper surface of the base body, a metal-to-metal joining is established between the reflective material layer 32 and the base body 20, through which the reflective material layer 32 functions as a interposer layer against the base body 20, resulting in an improvement of adhesion of the first resin 30 and the base body 20. Further, due to the fact that the first resin 30 includes the resin layer 31 and the fact that the upper surface of the resin layer 31 includes the sloped region 31B, the contact area between the resin layer 31 and the resin frame 50 is increased, resulting in an improvement of adhesion of the first resin 30 and the resin frame 50.

<Manufacturing Method of Light-Emitting Device>

Next, explanations are given to a manufacturing method of a light-emitting device according to the first embodiment.

Figure 4:
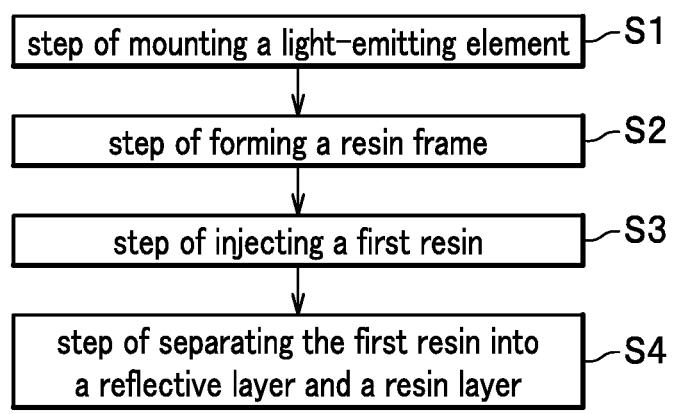
FIG. 4 shows a flow-chart of a manufacturing method of a light-emitting device according to the first embodiment.
Figure 5A:
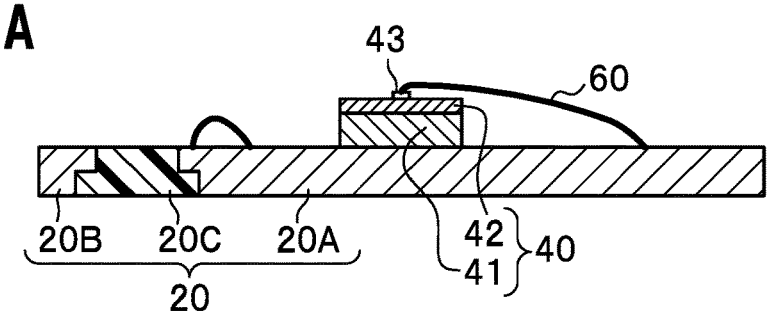
FIG. 5A is a cross section along the VA-VA line of FIG. 2, and schematically shows a cross section of the base body on which the light-emitting device is mounted in the first step of the manufacturing method of the light-emitting device according to the first embodiment.
Figure 5B:
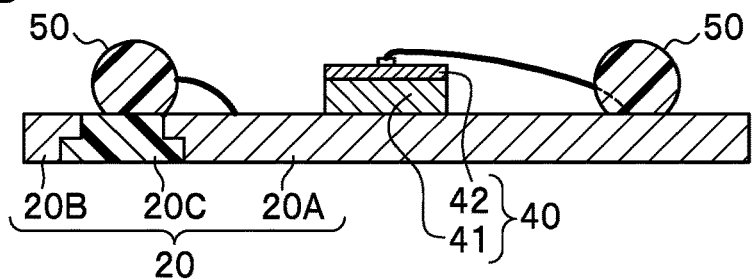
FIG. 5B is a cross section along the VB-VB line of FIG. 3, and schematically shows a cross section of the base body on which a resin frame is formed in the second step of the manufacturing method of the light-emitting device according to the first embodiment.
Figure 5C:
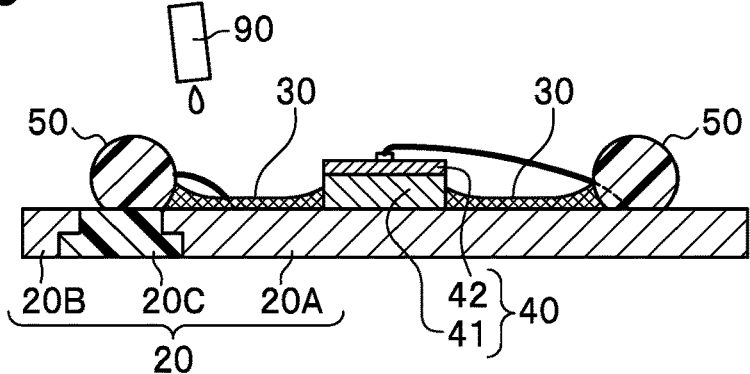
FIG. 5C schematically shows a cross section of the base body onto which the first resin is injected in the third step of the manufacturing method according to the first embodiment.
Figure 5D:
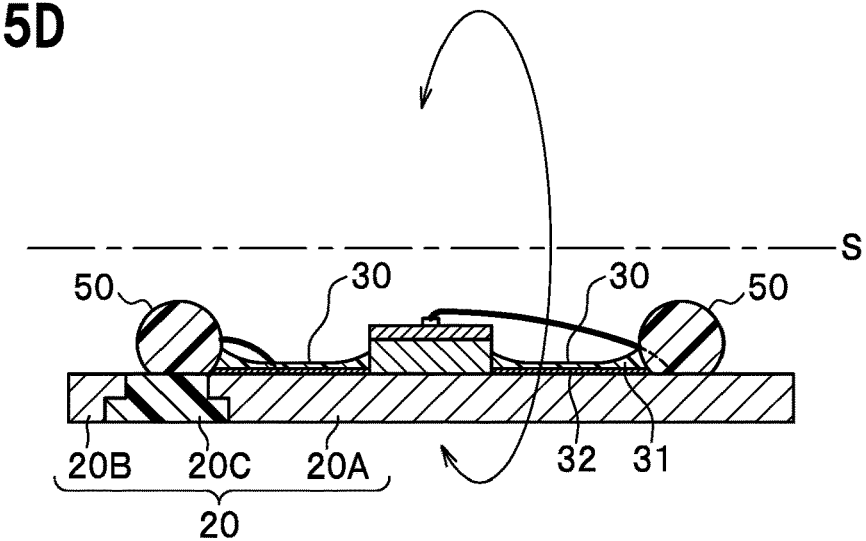
FIG. 5D is a cross section showing schematically a method of separating the first resin into a resin layer and a reflective material layer in the fourth step of the manufacturing method according to the first embodiment.

FIG. 4 shows a flow-chart of a manufacturing method of a light-emitting device according to the first embodiment. FIG. 5A schematically shows a cross section of the base body on which the light-emitting device is mounted in the first step of the manufacturing method of the light-emitting device according to the first embodiment, which cross section corresponds to a cross section along the VA-VA line of FIG. 2. FIG. 5B is a cross section along the VB-VB line of FIG. 3, and schematically shows a cross section of the base body on which a resin frame is formed in the second step of the manufacturing method of the light-emitting device according to the first embodiment. FIG. 5C schematically shows a cross section of the base body onto which the first resin is injected in the third step of the manufacturing method according to the first embodiment. FIG. 5D is a cross section showing schematically a method of separating the first resin into a resin layer and a reflective material layer in the fourth step of the manufacturing method according to the first embodiment.

As shown in FIG. 4, FIGS. 5A-5D, the manufacturing method of the light-emitting device 10 includes: a first step S1 for mounting the light-emitting element 40 on the upper surface of the base body 20 including the first lead 20A and the second lead 20B that are supported by the resin member 20C; a second step S2 for forming the resin frame 50 on the upper surface of the base body 20 to surround the light-emitting element 40; a third step S3 for injecting the first resin 30 containing a reflective material into inside the resin frame 50 so that the first resin 30 covers a part of the side surfaces of the light-emitting element 40, a part of the inner side surface of the resin frame 50, and the upper surface of the base body 20; a fourth step S4 for separating the first resin 30 into the reflective material layer 32 containing a reflective material and the resin layer 31 containing none of the reflective material, by applying a centrifugal force to the base body 20 by use of revolution of the base body.

(First Step)

As shown in FIG. 5A, the first step S1 is a step of mounting the light-emitting element 40 on the upper surface of the base body 20 including the first lead 20A and the second lead 20B that are supported by the resin member 20C. The light-emitting element 40 may be mounted on the mounting portion 21A of the first lead 20A.

In the first step S1, the light-emitting element 40 is mounted on the base body 20 applying a known method, wherein the bottom surface of the element-substrate 41 of the light-emitting element 40 and the upper surface of the base body 20 are joined using a known joining material. Next, the n-electrode 43 of the light-emitting element 40 is electrically connected via a wire 60 to the first lead 20A. In addition, the p-electrode 44 of the light-emitting element 40 is electrically connected via a wire 60 to the second lead 20B. It should be noted that a protection element 80 can also be electrically connected via a wire 60 to the first lead 20A. As a method of bonding, a known method such as ball bonding, wedge bonding, etc. can be applied.

(Second Step)

As shown in FIG. 5B, the second step S2 is a step of forming the resin frame 50 on the upper surface of the base body 20 to surround the light-emitting element 40. In the second step S2, a base resin in uncured state, which turns to the resin frame 50, is arranged in a region of the upper surface of the base body 20 where the resin frame 50 should be formed, and then the resin frame 50 is formed by curing the base resin. It should be noted that the viscosity of the base resin is adjusted in advance so that the resin frame 50 takes a frame shape after curing.

(Third Step)

As shown in FIG. 5C, the third step S3 is a step of injecting the first resin 30 containing a reflective material into inside the resin frame 50 so that the first resin 30 covers a part of the side surfaces of the light-emitting element 40, a part of the inner side surface of the resin frame 50, and the upper surface of the base body 20.

In the third step S3, the base resin in uncured state, which turns to the base of the first resin 30, is injected by potting or spraying, etc. into inside the resin frame 50. The amount of injected base resin is adjusted so that the resin does not reach the semiconductor layer of the light-emitting element 40. Then the base resin is cured after carrying out the next fourth step. Further, in the third step S3, when the uncured base resin is injected into inside the resin frame 50, a nozzle 90 may be arranged directly above the resin frame 50 so that the uncured base resin is injected to flow along the inner side surface of the resin frame 50 on the upper surface of the base body 20 and to the side surfaces of the light-emitting element 40. It should be noted that the uncured base resin can be injected at the center of the upper surface of the base body 20.

If the base resin is injected from the side of the resin frame 50 as explained above, due to difference in wettability between the upper surface of the base body 20, the inner side surface of the resin frame 50, and the side surfaces of the light emitting element 40, the sloped regions 31B, which respectively creep up to the inner side surface of the resin frame and to the side surfaces of the light-emitting element 40, are formed on the upper surface of the base resin on both sides of the flat region 31, which is formed directly above the base body 20, namely the sloped regions 31B are formed on both sides respectively facing toward the resin frame 50 and to the light-emitting element 40. The inner side surface of the resin frame 50 and the side surfaces of the light-emitting element 40 has higher wettability than the base body 20 having a metal surface, namely than the upper surface of the first lead 20A, due to difference of glossiness of these surfaces. Further, before injecting the uncured base resin, the inner side surfaces of the resin frame 50 can also be dipped into an organic solvent. By dipping the inner side surface of the resin frame 50 into the organic solvent in advance, the creeping up of the sloped region 31B can be enhanced. It should be noted that the shape etc. of the sloped regions 31B is adjusted by viscosity and the like of the injected base resin.

(Fourth Step)

As shown in FIG. 5D, the fourth step S4 is a step of separating the first resin 30 into the reflective material layer 32 containing a reflective material and the resin layer 31 containing no reflective material, by applying a centrifugal force due to revolution of the base body 20.

In the fourth step S4, the base body 20 is revolved around a center axis of revolution S above the upper surface of the base body 20. Thus, the centrifugal force is applied by use of the axis of revolution S so that the upper surface of the base body 20 faces to inside. The axis of revolution S above the upper surface of the base body 20 is parallel to the upper surface of the base boy 20, being arranged in a direction crossing the resin frame 50 and arranged above the base body 20. By the revolution of the base body 20, the reflective material contained in the first resin 30 is forced to sink to the upper side of the base body 20. Namely, the reflective material is arranged in a layer to cover the upper surface of the base body 20. It should be noted that, again, the shape of the upper surface of the reflective material layer 32 can be adjusted by the magnitude of the centrifugal force determined by the revolution speed, etc., and the upper surface of the reflective material layer 32 may be flat. It should be noted that, in the fourth step S4, after the revolution, the base body 20 can also be rotated around a rotation axis that is arranged at the center of the base body 20 in a direction perpendicular to the longitudinal direction of the base body 20. By this rotation, the height of the sloped regions of the resin layer 31, h1, h2 (refer to FIG. 1C) can be formed higher.

Further, the creeping of the sloped regions 31B occurs also when the first resin 30 is cured after the fourth step S4.

In the manufacturing method of the light-emitting device 10, a light-emitting device 10 having a better light extraction and better adhesion can be manufactured, because the first resin 30 including the resin layer 31 covering the sloped region 31B, which covers a part of the inner side surface of the resin frame 50, and the reflective material layer 32, in which the reflective material is arranged to cover the upper surface of the base body 20, can be formed by conducting the third step S3 for injecting the first resin 30 and the fourth step S4 for separating the first resin 30 into the reflective material layer 32 and the resin layer 31. In the following, explanations are given to respective steps.

Second Embodiment

<Light-Emitting Device>

Figure 6:
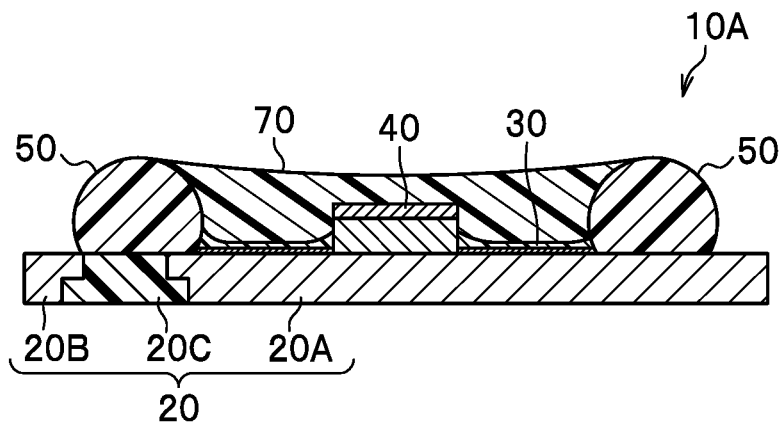
FIG. 6 is a cross section showing schematically a configuration of the light-emitting device according to a second embodiment.

At first, a light-emitting device according to a second embodiment is explained. FIG. 6 is a cross section showing schematically a configuration of the light-emitting device according to the second embodiment. It should be noted that the same constituents as the light-emitting device according to the first embodiment are provided with same reference numerals and their explanations are omitted.

The light-emitting device 10A, in addition to the same configuration as the above light-emitting device 10, further includes a second resin 70 covering the upper surface of the light-emitting element 40 and the upper surface of the first resin 30. Further, in the light-emitting device 10A, the second resin layer 70 may contain a phosphor.

(Second Resin 70)

The second resin 70 is a resin layer covering the upper surface of the semiconductor layer 42 of the light-emitting element 40 and the upper surface of the resin layer 31 of the first resin 30, and is arranged to contact the inner side surface of the resin frame 50 so that the height of the of the second resin 70, when seen in a cross-sectional view, does not exceed the height of the resin frame 50.

As a material for the second resin 70, a resin material or a glass material, which are translucent, can be used. In particular, a resin material is used for the material of the second resin 70. Because the first resin 30 as well as the resin frame 50 respectively include a resin material, and because the second resin 70 is also a resin material, it is possible to improve the adhesion between the second resin 70 and the first resin 30, and also the adhesion between the second resin 70 and the resin frame 50. As a resin material for the second resin 70, polycarbonate resin, epoxy resin, phenol resin, silicone resin, acryl resin, polymethylpentene resin, polynorbornene resin, or a modified resin of these resins, or a hybrid resin containing at least one of these resins can be used. In particular, for the material of the second resin 70, dimethylsilicone resin, phenylsilicone resin, which have a better light resistance, are preferred. The second resin 70 may contain a phosphor and can also contain a light diffusing agent. Further, when the second resin 70 contains a phosphor, the shape of the upper surface of the second resin 70 may have a form that its center curves protruding downwards so that the distance between the phosphor and the light-emitting element 40 becomes smaller.

(Phosphor)

For the phosphor, particles of a phosphor, which can be excited by the light from the light-emitting element 40 and can convert the wavelength of the light emitted from the light-emitting element 40 or reflected by the first resin 30, is used. For example, as a phosphor that can be excited by blue light-emitting element or by ultraviolet light-emitting element, yttrium-aluminum-garnet phosphor activated with cerium (YAG:Ce), lutetium-aluminum-garnet activated with cerium (LAG:Ce), nitride-containing calcium aluminosilicate phosphor activated with europium and/or chromium ($CaO$—$Al_2O_3$—$SiO_2$:Eu, Cr), silicate phosphor activated with europium (($Sr,Ba)_2SuO_2$:Eu), nitride phosphor such as β-sialon phosphor, CASN phosphor, and SCASN phosphor, fluoride phosphor such as KSF phosphor, sulfide phosphor, chloride phosphor, silicate phosphor, phosphate phosphor, quantum dot phosphor can be considered. By combination of these phosphors and a blue light-emitting element or an ultraviolet light-emitting element, a light-emitting device 10 having various wavelength can be manufactured.

(Light Diffusion Agent)

As a light diffusion agent, titanium oxide, zirconium oxide, aluminum oxide, silicon oxide, etc. can be used. In particular, titanium oxide is preferred, because it is relatively stable against water and because it has a large refraction index.

In the light-emitting device 10A, by including the second resin 70, the intrusion of dust and the like from outside into the light-emitting device 10A can be suppressed, and therefore the reliability is improved. Further, in the light-emitting device 10A, because the second resin 70 contains a phosphor, the wavelength of the light emitted from the light-emitting element 40 or of the light reflected by the first resin 30 can be converted, enabling adjustment of the color tone of the extracted light. In particular, when the first resin 30 has the sloped regions 31B, because the distance between the phosphor of the second resin 70 and the light-emitting element 40 becomes smaller, the fluorescence efficiency is improved. Further, when the cross section of the resin frame 50 has a curved shape and the resin layer 31 is formed up to just below the inner-most point P of the resin frame 50, the fluorescence efficiency is improved, because the phosphor of the second resin 70 will not enter into the lower part of the resin frame 50.

<Manufacturing Method of Light-Emitting Device>

Figure 7:
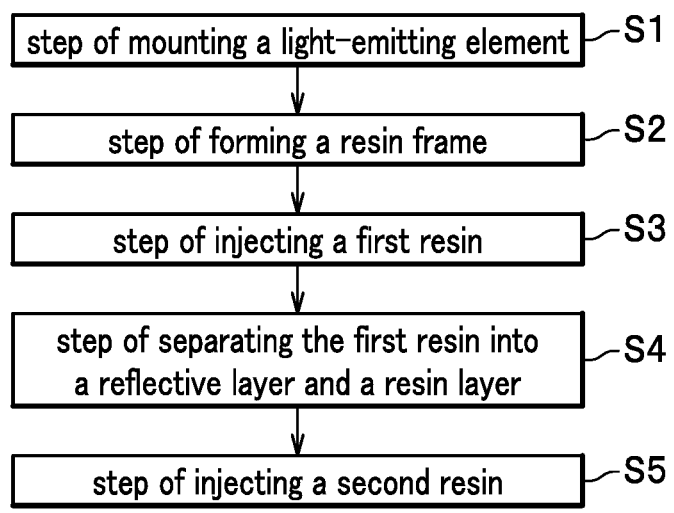
FIG. 7 is a flow-chart showing a flow of a manufacturing method according to the second embodiment.

Next, the manufacturing method of a light-emitting device according to the second embodiment is explained. FIG. 7 is a flow-chart showing a flow of a manufacturing method according to the second embodiment. It should be noted that, regarding the steps, which are same as the first embodiment, same reference numbers as the first embodiment are given to them and their explanations are omitted.

In addition to the steps S1-S4, which are same as the manufacturing method of the light-emitting device 10, the manufacturing method of the light emitting device 10A further includes a fifth step S5 for injecting the second resin. Due to the fact that the manufacturing method of the light-emitting device 10A includes this fifth step S5, the reliability and the color adjustability are improved.

The fifth step S5 is a step of injecting the second resin 70 into inside the resin frame 50 so that the second resin 70 covers the upper surface of the light-emitting element 40 and the upper surface of the resin layer 31 of the first resin 30. The second resin 70 may be injected so that the inner side surface of the resin frame 50 contacts with the second resin 70. The injecting of the second resin 70 is carried out by a similar method as the first resin 30, by potting or spraying, etc.

Though it has been explained that, as an example, the second resin 70 is formed to have its center curved protruding downwards, it should be noted that, the second resin 70 can also be formed to have a same height in a uniform manner. Further, the second resin 70 can be formed to have its center curved upwards so that the second resin 70 becomes higher at directly above the light-emitting element 40.

Third Embodiment

<Light-Emitting Device>

Figure 8A:
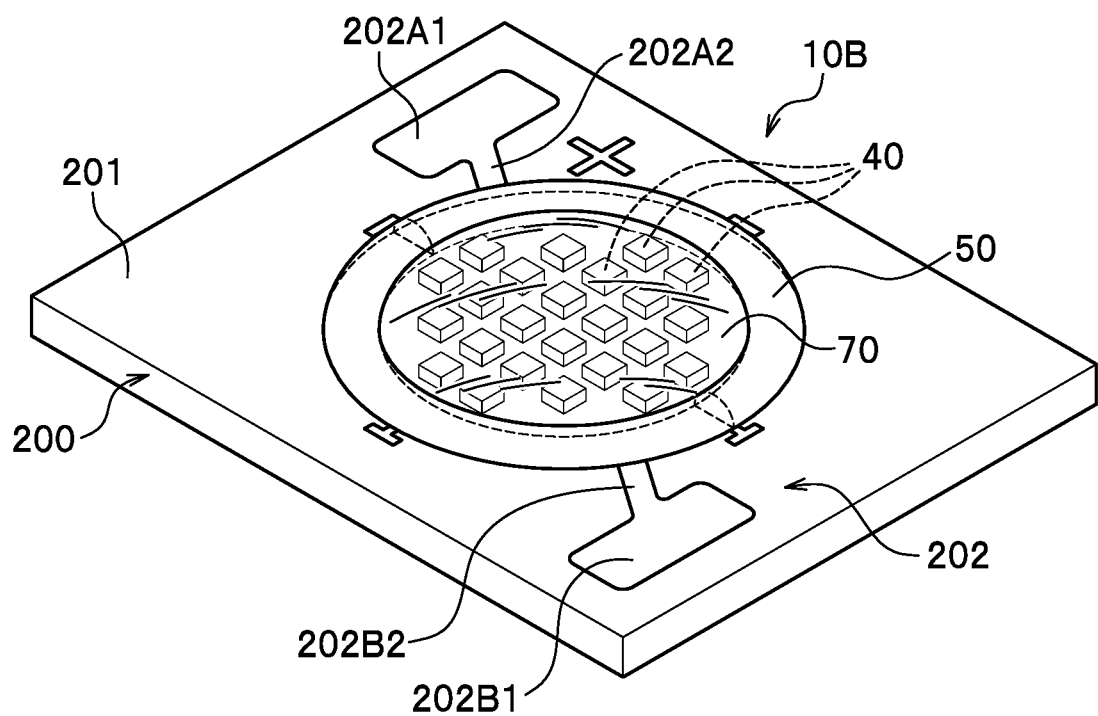
FIG. 8A schematically shows a perspective view of a construction of a light-emitting device according to a third embodiment.
Figure 8B:
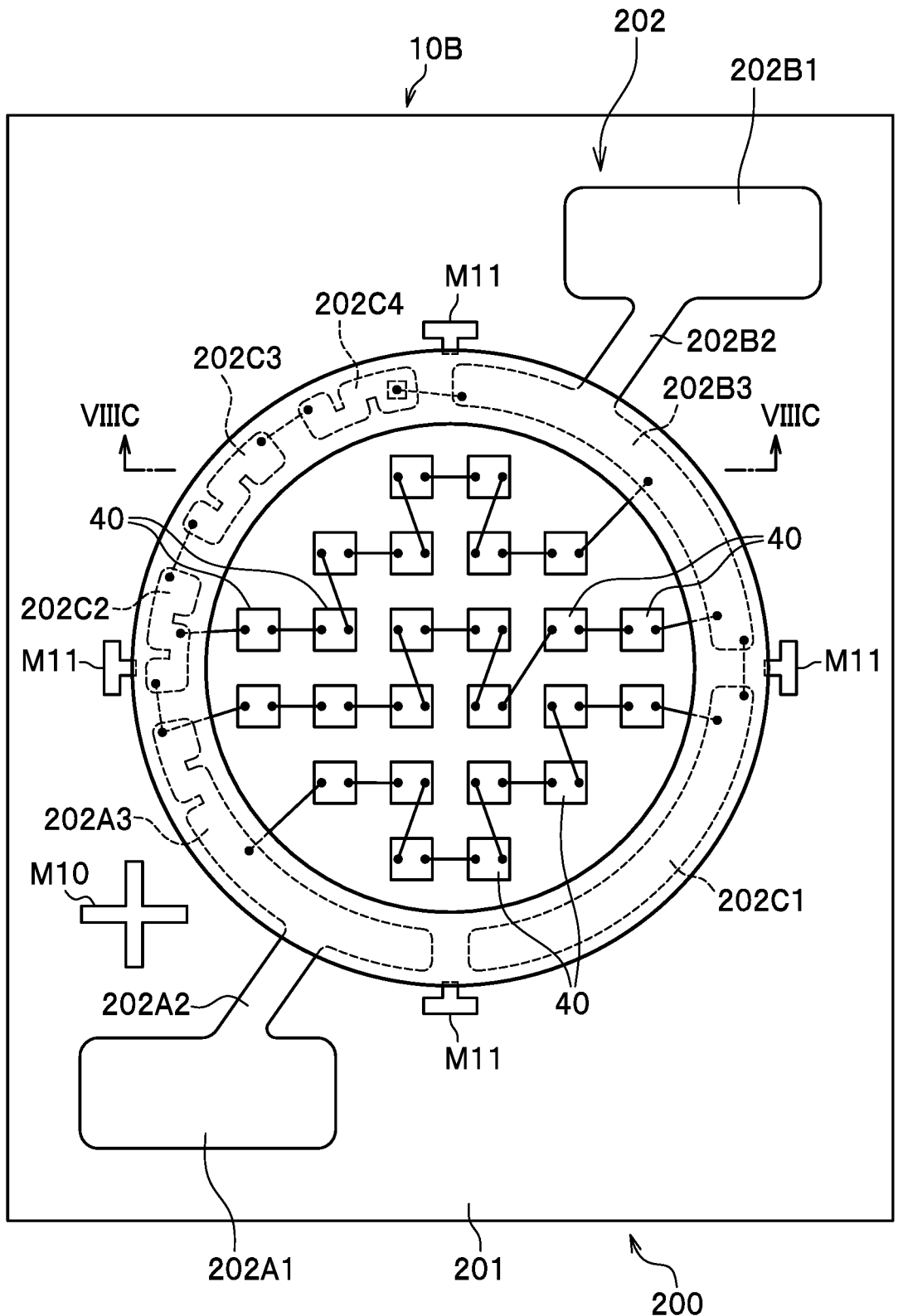
FIG. 8B schematically shows a plan view of a construction of a light-emitting device according to the third embodiment.
Figure 8C:
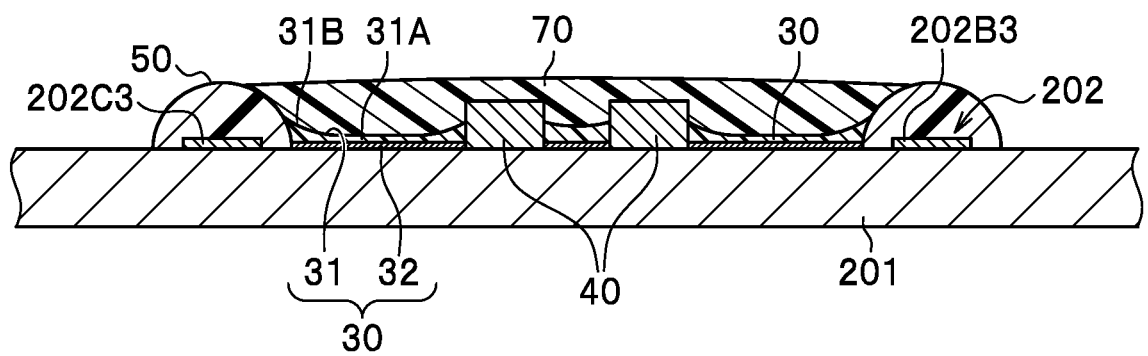
FIG. 8C shows a cross-sectional view along the VIIIC-VIIIC line of FIG. 8B.

Next, explanation is given about a light-emitting device according to a third embodiment. FIG. 8A schematically shows a perspective view of a construction of a light-emitting device according to a third embodiment. FIG. 8B schematically shows a plan view of a construction of a light-emitting device according to the third embodiment. FIG. 8C shows a cross-sectional view along the VIIIC-VIIIC line of FIG. 8B.

The light-emitting device 10B includes: a base member 201; a base body 200 having a wiring layer 202 formed on an upper surface of the base member; a light-emitting element 40 mounted on an upper surface of the base body 200; a resin frame 50 arranged on the upper surface of the base body 200; and a first resin 30 that contains a reflective material and is arranged inside the resin frame 50 to cover a part of side surfaces of the light-emitting element 40, a part of inner side surface of the resin frame 50, and the upper surface of the base body 200; wherein the first resin 30 includes a reflective material layer 32 that contains the reflective material and a resin layer 31 that is arranged on the upper surface of the reflective material layer 32 and does not contain the reflective material; wherein, in the reflective material layer 32, the reflective material is arranged to cover the upper surface of the base body 200; and wherein the upper surface of the resin layer 31, seen in cross section, includes a flat region 31A and a sloped region 31B having a height, measured from the upper surface of the base body, being gradually elevated as the upper surface of the resin layer 31 approaches the inner side surface of the resin frame 50. In the following, respective configurations are explained.

Because the light-emitting device 10B basically includes a same construction as the light-emitting device 10 and the construction of the base body 200 is different from the base body 20, it will be explained mainly about the difference and explanations about other parts that are already explained will be omitted occasionally.

The base body 200 includes a base member 201 and a wiring layer 202 formed on the upper surface of the base member. The light-emitting elements 40 are arranged with an array in a mounting region at center of the base body 200. The wiring layer 202 is formed in the periphery of the light-emitting elements 40, and a resin frame 50 is provided to cover a circularly formed portion of the wiring layer 202.

The base member 201 is formed with an insulation material in a plate-like shape. Here, for the base member 201, a material having a high heat dissipation may be used, or a material having a high light-shielding and a high strength as the base member may be used. Specifically, a ceramic such as aluminum oxide, aluminum nitride, mullite, and a resin such as epoxy resin, phenol resin, polyimide resin, BT resin, (bismaleimide triazine resin), polyphthalamide (PPA), a metal (aluminum, copper, etc.), and further a composite material configured with a resin and a metal or a ceramic can be considered. Further, when a material having high transparency is used, a known light-shielding material is mixed.

The wiring layer 202 is formed on the base member 201 so that the wiring layer surrounds circularly the region in which a plurality of light-emitting elements are arranged, and includes a positive wiring electrode pad 202A1 on the anode side and a negative wiring electrode pad 202б1 on the cathode side. The positive wiring electrode pad 202A1 and the negative wiring electrode pad 202б1 are formed as a rectangle to have a larger wiring area than the other wiring portions for easier electrical connection to outside. Further, an extension wiring 202A2 is formed continuously to the positive wiring electrode pad 202A1, and further, a first connection wiring 202A3 is formed in a circular arc shape continuously to the extension wiring 202A2. Similarly, an extension wiring 202B2 is formed continuously to the positive wiring electrode pad 202B1, and further, a second connection wiring 202B3 is formed in a circular arc shape continuously to the extension wiring 202б2. In addition, the first connection wiring 202A3 and the second connection wiring 202B3, together with other wirings, a plurality of third connection wirings 202C1-202C4, are arranged circularly in truncations. Here, the third connection wirings 202C1-202C4 are formed in four locations. It is sufficient with that these third connection wirings 202C1-202C4 form a circular wiring as a whole together with the first connection wiring 202A3 and the second connection wiring 202B3, it does not matter whether anyone or all of the third connection wirings are not formed, according to the lengths of the circular arcs of the first connection wiring 202A3 and the second connection wiring 202B3. The wiring layer 202 (positive wiring electrode pad 202A1, extension wiring 202A2, negative wiring electrode pad 202б1, extension wiring 202B2, third connection wirings 202C1-202C4) can be formed by use of a metal, for example, Cu, Ag, Au, Al, Pt, Ti, W, Pd, Fe, Ni, and an alloy containing these metals. Such wirings can be formed by printing, electrolytic plating, non-electrolytic plating, evaporating, sputtering, etc. It should be noted that, when the base member 201 is metallic, an insulating layer such as a glass-epoxy may also be formed between the base member 201 and the wiring layer 202.

The resin frame 50 covers the first connection wiring 202A3, the second connection wiring 202B3, and the third connection wirings 202C1-202C4, and is formed in a circular shape. This resin frame 50 is formed with a same construction and a same material as explained already.

The first resin 30, being arranged inside the resin frame 50, namely in a region surrounded with the resin frame 50, is a resin layer containing a reflective material and covering a part of side surfaces of the light-emitting element 40, a part of inner side surface of the resin frame 50, and the upper surface of the base body 200. This first resin 30 is also formed with a same construction and with a same material as explained already.

Further, a plurality of the light-emitting elements 40 are arranged within the resin frame 50 of the base body 200 and are connected by a wiring to anyone of the first connection wiring 202A3, the second connection wiring 202B3, and the third connection wirings 202C1-202C4.

Further, on the upper surface of the base body 200, an electrode identifying mark M10 for distinguishing the cathode and the anode may be formed and a plurality of indication marks M11 may be formed for indication when the resin frame 50 is arranged.

It should be noted that, similarly as already explained, for example, the second resin 70 may be arranged inside the resin frame 50 to cover the light-emitting element 40 and the first resin 30.

The light-emitting device 10B provides an equivalent effect as the already explained light-emitting devices 10, 10A.

<Manufacturing Method of Light-Emitting Device>

Next, explanations are given to a manufacturing method of a light-emitting device 10B. It should be noted that the light-emitting device 10B is assumed to be manufacture by a manufacturing process equivalent to the manufacturing method as explained referring to FIG. 4.

The manufacturing method of the light-emitting device 10B includes: a first step S1 for mounting the light-emitting elements 40 on the upper surface of the base body 200; a second step S2 for forming the resin frame 50 on the upper surface of the base body 200 to surround the light-emitting elements 40 and to cover the upper surface of the first connection wiring 202A3, the second connection wiring 202B3, and the third connection wirings 202C1-202C4; a third step S3 for injecting the first resin 30 containing a reflective material into inside the resin frame 50 so that the first resin 30 covers a part of the side surfaces of the light-emitting elements 40, a part of the inner side surface of the resin frame 50, and the upper surface of the base body 200; a fourth step S4 for separating the first resin 30 into the reflective material layer 32 containing a reflective material and the resin layer 31 containing none of the reflective material, by applying a centrifugal force to the base body 200 by use of revolution of the base body 200. It should be noted that, in the first step of mounting the light-emitting element 40, the light-emitting element 40, the first connection wiring 202A3, the second connection wiring 202B3, and the third connection wirings 202C1-202C4 are connected via wires for electrical connections. About respective steps, explanations are omitted, because equivalent works are conducted similar to the above already explained steps.

Though, in the above embodiments, it is described more specifically about implementing the present invention, the scope of the present invention is not limited to these descriptions, and the present invention should be construed wider based on the descriptions in the scope of claims. Further, without mentioning, any modification or any alteration based on the present descriptions are included in the scope of the present invention.

The invention claimed is:

1. A light-emitting device comprising:
a base body comprising a resin member, a first lead, and a second lead, wherein the first lead and the second lead are supported by the resin member;
a light-emitting element mounted on an upper surface of the base body, wherein the light-emitting element comprises an element-substrate, and a semiconductor layer located on the element-substrate;
a resin frame located on the upper surface of the base body, surrounding the light-emitting element; and
a first resin located inside the resin frame to cover a part of side surfaces of the light-emitting element, a part of an inner side surface of the resin frame, and the upper surface of the base body, wherein the first resin comprises:
a reflective material layer that contains a reflective material, and
a resin layer that is located on an upper surface of the reflective material layer and does not contain the reflective material;
wherein the reflective material is located in the reflective material layer to cover the upper surface of the base body;
wherein, in a cross-sectional view, an upper surface of the resin layer comprises a flat region and a sloped region, and, in the sloped region, a height of the upper surface of the resin layer, measured from the upper surface of the base body, gradually increases in an outward direction from the flat region as the upper surface of the resin layer approaches the inner side surface of the resin frame; and
wherein, in the cross-sectional view, a height of an upper surface of the first resin measured from the base body is less than a height of a bottom surface of the semiconductor layer measured from the base body.

2. The light-emitting device according to claim 1, wherein an entire side surface of the resin layer facing toward the resin frame contacts to the resin frame.

3. The light-emitting device according to claim 1, further comprising:
a second resin covering an upper surface of the light-emitting element and an upper surface of the first resin.

4. The light-emitting device according to claim 3, wherein the second resin comprises a phosphor.

5. The light-emitting device according to claim 1, wherein the light-emitting element is mounted on the first lead; and
wherein the resin frame is located to cover a connection portion of the first lead and the resin member.

6. The light-emitting device according to claim 1, wherein the reflective material is titanium oxide.

7. The light-emitting device according to claim 1, wherein the resin frame and the first resin contain a base resin of a same material.

8. The light-emitting device according to claim 1, wherein, in the cross-sectional view, an inner side surface of the resin frame has a curved shape that bulges to a side facing toward the light-emitting element.

9. The light-emitting device according to claim 8, wherein, in the cross-sectional view, the upper surface of the first resin covering the inner side surface of the resin frame has a height measured from the upper surface of the base body that is less than that of a position of an inner-most point of the resin frame.

10. The light-emitting device according to claim 8, wherein a portion of the resin layer is located below an inner-most point of the resin frame.

11. A light-emitting device comprising:
a base member;
a base body formed on an upper surface of the base member, the base body comprising a wiring layer;
a light-emitting element mounted on an upper surface of the base body, wherein the light-emitting element comprises an element-substrate, and a semiconductor layer located on the element-substrate;
a resin frame located on the upper surface of the base body; and
a first resin located inside the resin frame to cover a part of side surfaces of the light-emitting element, a part of inner side surface of the resin frame, and the upper surface of the base body, the first resin comprising:
a reflective material layer that contains a reflective material, and
a resin layer that is located on an upper surface of the reflective material layer and does not contain the reflective material;
wherein the reflective material is located in the reflective material layer to cover the upper surface of the base body; and
wherein the upper surface of the resin layer comprises a flat region and a sloped region, wherein a height of the upper surface of the resin layer, measured from the upper surface of the base body, gradually increases as the upper surface of the resin layer approaches the inner side surface of the resin frame; and
wherein, in the cross-sectional view, a height of an upper surface of the first resin measured from the base body is less than a height of a bottom surface of the semiconductor layer measured from the base body.

12. The light-emitting device according to claim 11, wherein entire side surface of the resin layer facing toward the resin frame contacts to the resin frame.

13. The light-emitting device according to claim 11, further comprising:
a second resin covering an upper surface of the light-emitting element and an upper surface of the first resin.

14. The light emitting device according to claim 11, wherein the base member is formed of a ceramic material.

15. The light emitting device according to claim 11, wherein the base member is formed of a metal material.

16. The light-emitting device according to claim 1, wherein, in the cross-sectional view, the resin frame has a shape of a circle, a partial circle, an oval, a partial oval, or a rectangle.

17. The light-emitting device according to claim 1, wherein, in the cross-sectional view, an inner side surface of the resin frame facing the light-emitting element has a convex shape.

18. The light-emitting device according to claim 17, wherein, in the cross-sectional view, the reflective material layer extends under an innermost point of the inner side surface of the resin frame having the convex shape.

19. The light-emitting device according to claim 18, wherein, in the cross-sectional view, the resin frame has a shape of a circle or a partial circle, and the innermost point of inner side surface of the resin frame is a point on the circle or the partial circle.

20. The light-emitting device according to claim 1, wherein the reflective material layer and the resin layer have no interface therebetween.

21. The light-emitting device according to claim 1, wherein, in the cross-sectional view, an entirety of the upper surface of the reflective material layer is flat.

22. The light-emitting device according to claim 1, wherein, in the cross-sectional view, the upper surface of the resin layer comprises an additional sloped region, and, in the additional sloped region, a height of the upper surface of the resin layer, measured from the upper surface of the base body, gradually increases in an inward direction from the flat region as the upper surface of the resin layer approaches a lateral surface of the light-emitting element.

23. A light-emitting device comprising:
a base body comprising a resin member, a first lead, and a second lead, wherein the first lead and the second lead are supported by the resin member;
a light-emitting element mounted on an upper surface of the base body;
a resin frame located on the upper surface of the base body, surrounding the light-emitting element, wherein, in the cross-sectional view, an inner side surface of the resin frame has a curved shape that bulges to a side facing toward the light-emitting element; and
a first resin located inside the resin frame to cover a part of side surfaces of the light-emitting element, a part of an inner side surface of the resin frame, and the upper surface of the base body, wherein the first resin comprises:
a reflective material layer that contains a reflective material, and
a resin layer that is located on an upper surface of the reflective material layer and does not contain the reflective material;
wherein the reflective material is located in the reflective material layer to cover the upper surface of the base body;
wherein, in a cross-sectional view, an upper surface of the resin layer comprises a flat region and a sloped region, and, in the sloped region, a height of the upper surface of the resin layer, measured from the upper surface of the base body, gradually increases in an outward direction from the flat region as the upper surface of the resin layer approaches the inner side surface of the resin frame; and
wherein, in the cross-sectional view, a height of the upper surface of the first resin covering the inner side surface of the resin frame measured from the upper surface of the base body is less than a height of a position of an inner-most point of the resin frame measured from the upper surface of the base body.

* * * * *

UNITED STATES PATENT AND TRADEMARK OFFICE
CERTIFICATE OF CORRECTION

PATENT NO. : 11,189,764 B2
APPLICATION NO. : 16/687853
DATED : November 30, 2021
INVENTOR(S) : Hiroaki Ukawa, Ryuichi Nakagami and Ryuji Muranaka It is certified that error appears in the above-identified patent and that said Letters Patent is hereby corrected as shown below:

In the Claims

Claim 3, Column 18, Lines 46-47:
Please delete:
"a second resin covering an upper surface of the light-emitting element and an upper surface of the first resin."
Please replace with:
"a second resin covering an upper surface of the light-emitting element and the upper surface of the first resin."

Signed and Sealed this
Seventh Day of March, 2023

*Katherine Kelly Vidal*

Katherine Kelly Vidal
*Director of the United States Patent and Trademark Office*